United States Patent [19]
Narita

[11] Patent Number: 5,436,487
[45] Date of Patent: Jul. 25, 1995

[54] OUTPUT CIRCUIT HAVING THREE POWER SUPPLY LINES

[75] Inventor: Kaoru Narita, Tokyo, Japan

[73] Assignee: NEC Corporation, Tokyo, Japan

[21] Appl. No.: 248,729

[22] Filed: May 25, 1994

[30] Foreign Application Priority Data

May 25, 1993 [JP] Japan .................. 5-146985

[51] Int. Cl.$^6$ ................. H01L 27/02; H01L 29/72
[52] U.S. Cl. ................. 257/378; 327/409; 327/412; 327/542
[58] Field of Search .............. 257/368, 378; 307/499, 307/501, 570; 327/409, 412, 542

[56] References Cited

U.S. PATENT DOCUMENTS 4,999,518 3/1991 Dhong et al. .............. 307/570

Primary Examiner—Ng e,cir oNgân V.
Attorney, Agent, or Firm—Sughrue, Mion, Zinn, Macpeak & Seas

[57] ABSTRACT

In an output circuit having first and second MOS transistors in series between a first power supply line and a second power supply line, and a third MOS transistor, the gates of the first and second transistors are connected to first and second input nodes, respectively, and an output node is provided between the first and second MOS transistors. The third MOS transistor is connected between one of the input nodes and the output node. The gate of the third MOS transistor is connected to a third power supply line.

14 Claims, 8 Drawing Sheets

OUTPUT CIRCUIT HAVING THREE POWER SUPPLY LINES

BACKGROUND OF THE INVENTION

1. Field of the Invention

The present invention relates to a semiconductor device, and more particularly, to the improvement of a metal oxide semiconductor (MOS) output circuit.

2. Description of the Related Art

In a MOS memory device such as a dynamic random access memory (DRAM), a prior art output circuit is formed by two MOS transistors in series between a positive potential power supply $V_{cc}$ such as 5 V or 3.3 V and a ground potential power supply $V_{ss}(=0\ V)$. When two input signals at two input nodes are supplied to gates of the respective MOS transistors, an output signal is obtained at an output node between the MOS transistors in accordance with the input signals. In this case, if the output signal is too low or high, an off-state of one of the two transistors is changed to ON. Particularly, as a result, if minority carriers are generated, data stored in memory cells may be destroyed. In order to avoid this, an additional MOS transistor is provided between one of the input nodes and the output node.

However, there are actually a plurality of output circuits in a MOS memory device. As a result, one output circuit may be erroneously operated by the operation of the other output circuits. This will be explained later in detail.

SUMMARY OF THE INVENTION

It is an object of the present invention to provide an output circuit which can avoid interference with other circuits.

According to the present invention, in an output circuit having first and second MOS transistors in series between a first power supply line and a second power supply line, and a third MOS transistor, the gates of the first and second transistors are connected to first and second input nodes, respectively, and an output node is provided between the first and second MOS transistors. The third MOS transistor is connected between one of the input nodes and the output node. The gate of the third MOS transistor is connected to a third power supply line. Thus, even when the potential at the first or second power supply line is fluctuated by the operation of other output circuits, the potential at the third power supply line is not fluctuated.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, a prior art MOS output circuit is explained with reference to FIG. 1.

Figure 1:
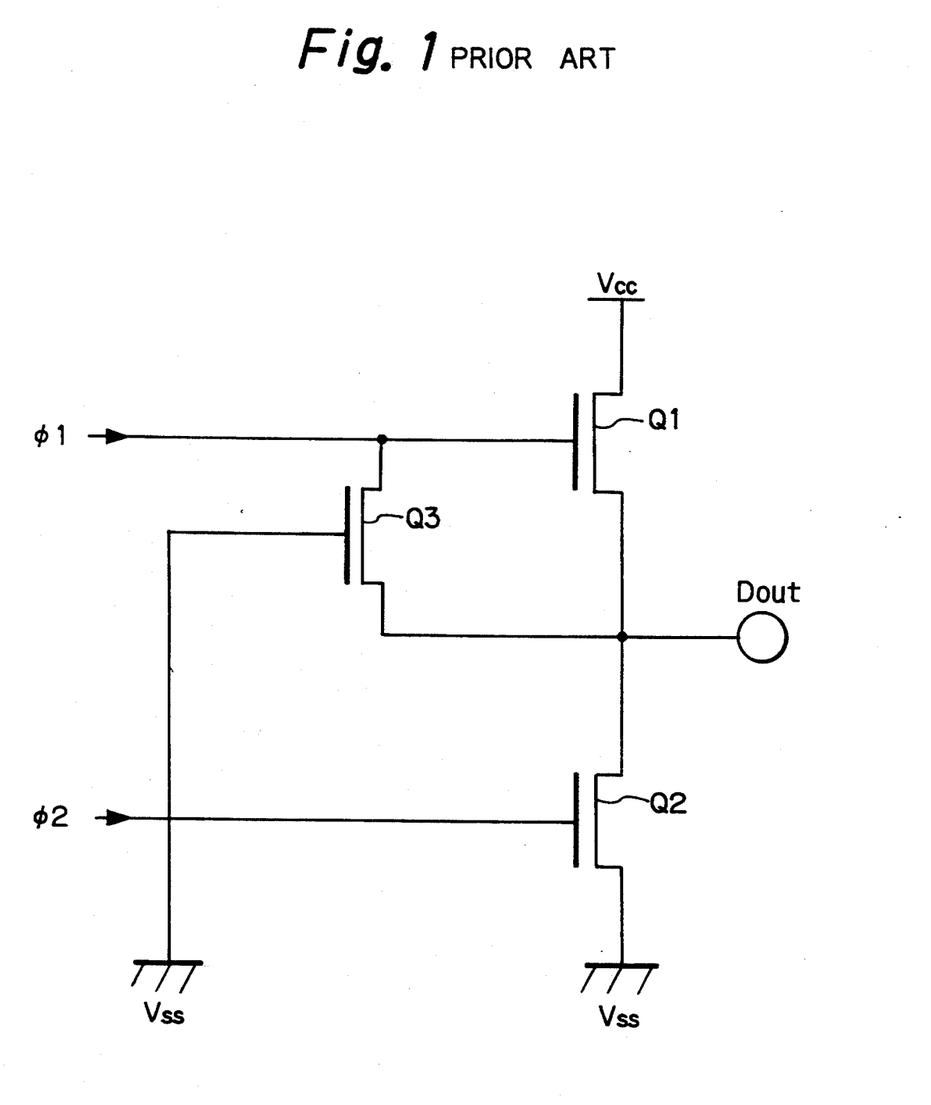
FIG. 1 is a block diagram illustrating a prior art semiconductor device.

In FIG. 1, a prior art MOS output circuit used in a DRAM or the like is constructed by N-channel MOS transistors Q1 and Q2 (in this case, enhancement type) connected in series between a power supply line $V_{cc}$ of a high potential such as 5 V and a power supply line $V_{ss}$ of a ground potential. Input signals $\phi1$ and $\phi2$ are supplied to gates of the transistors Q1 and Q2, and an output signal Dout is obtained at a node between the transistors Q1 and Q2. The relationship between the input signals $\phi1$ and $\phi2$ and the output signal Dout is indicated by the following table:

| $\phi1$ | $\phi2$ | Dout |
|---|---|---|
| low | low | HZ |
| low | high | low |
| high | low | high |

Note that $\phi1=\phi2=$high is prohibited. Here, when $\phi1=$low level and $\phi2=$high level, if the output signal Dout falls to a negative potential due to the external noise, the gate potential of the transistor Q1 is relatively increased to thereby turn ON the transistor Q1. As a result, when the MOS output circuit is applied to an N-channel MOS dynamic RAM, minority carriers, i.e., electrons are generated within a semiconductor substrate to destroy the data of memory cells.

In order to prevent the above-mentioned output transistor Q1 from being turned ON, an N-channel MOS transistor Q3 is provided between the gate of the output transistor Q1 and a terminal that supplies the output signal Dout. That is, when the potential of the output signal Dout is made negative, the gate-source voltage of the transistor Q3 becomes smaller than $V_{ss}-V_{thn}$ where $V_{thn}$ is a threshold voltage of the transistor Q3, so that the transistor Q3 is turned ON to reduce the potential of the input signal $\phi1$, thus preventing the output transistor Q1 from being turned ON.

Figure 2:
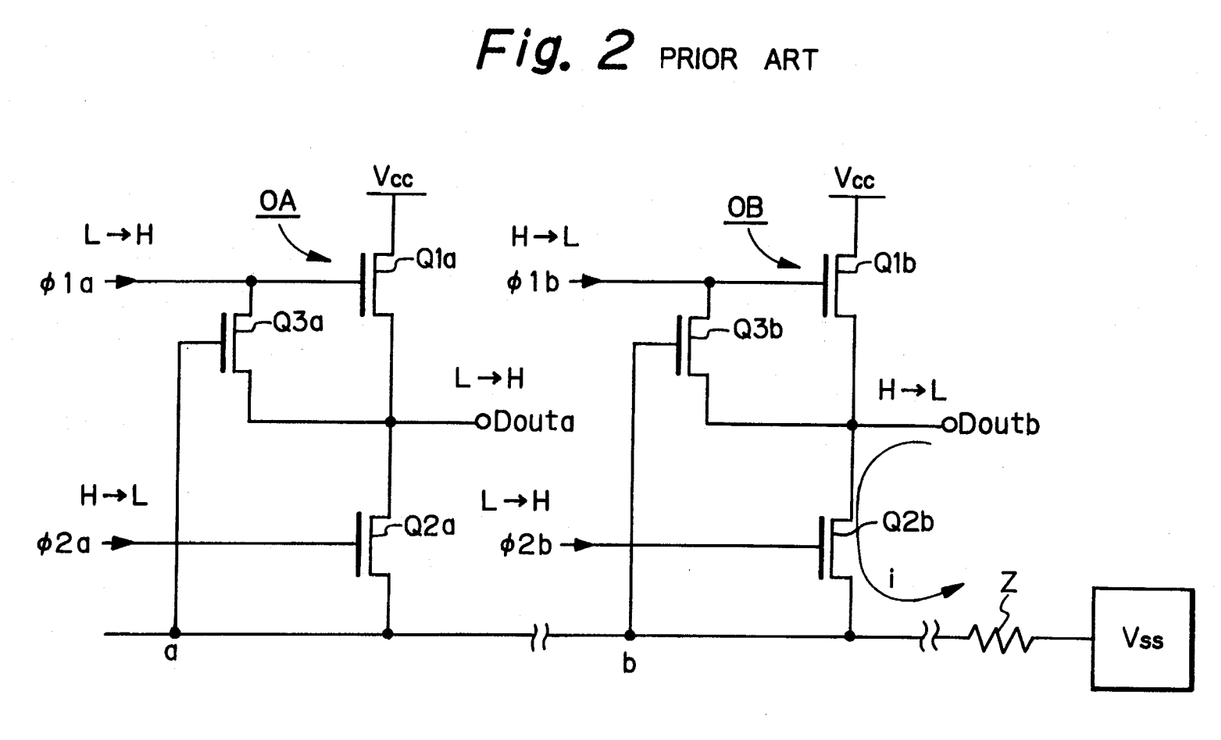
FIG. 2 is a circuit diagram of a semiconductor device where a plurality of circuits as illustrated in FIG. 2 are arranged.

However, as illustrated in FIG. 2, a plurality of output circuits OA, OB, . . . each of which has the same configuration as the output circuit of FIG. 1 are actually located in the same semiconductor chip, so that the potential at the power supply line Vss may be greatly fluctuated particularly when switching data. For example, the peak value of this potential may reach 2 V. Now, assuming that, in an output circuit OB, when an input signal $\phi1b$ is changed from a high level to a low level and an input signal $\phi2b$ is changed from a low level to a high level, a relatively large current i flows through an impedance Z of the power supply line Vss to temporarily raise the potentials at nodes a and b. On the other hand, simultaneously, in an output circuit OA, when an input signal $\phi_{2a}$ is changed from a low level to a high level and an input signal $\phi_{2a}$ is changed from a high level to a low level, so as to increase an output signal Douta, a transistor Q3a is turned ON, since the potential at node a is temporarily raised, and accordingly, the input signal $\phi_{1a}$, i.e., the gate potential of an output transistor Q1a falls. As a result, the potential of the output signal Douta never normally becomes a high level, thus inviting erroneous operation.

Figure 3:
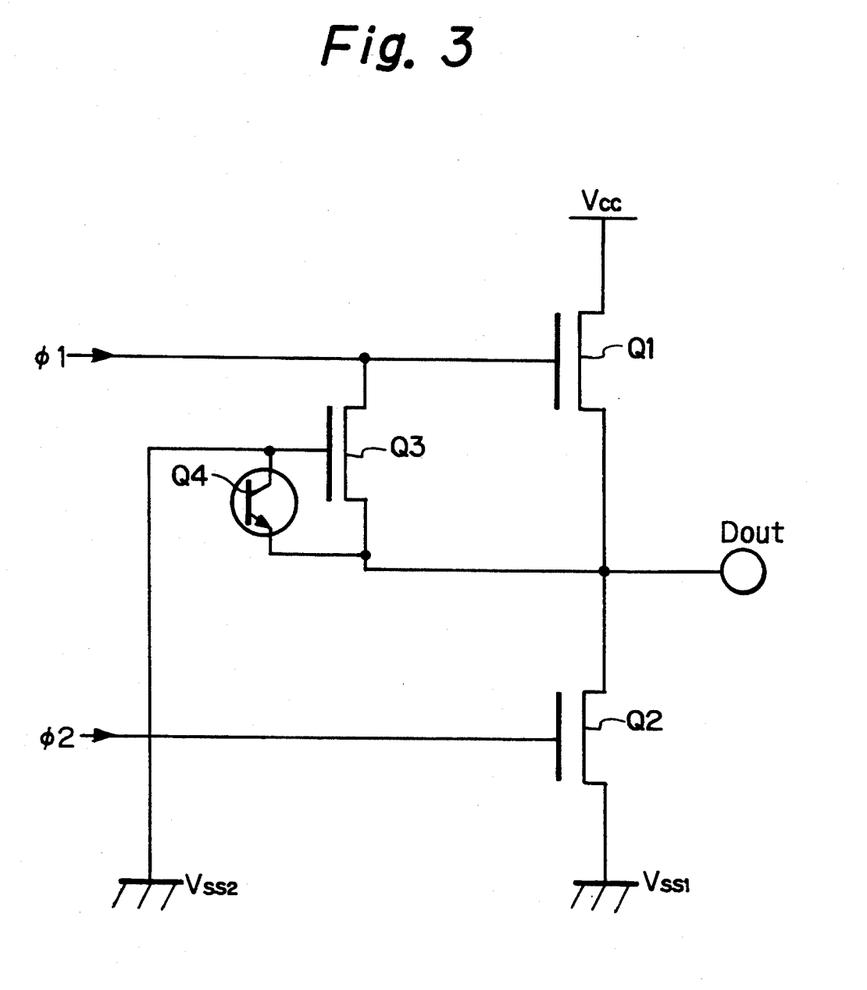
FIG. 3 is a circuit diagram illustrating a first embodiment of the semiconductor device according to the present invention.

In FIG. 3, which is a circuit diagram illustrating a first embodiment of the semiconductor device according to the present invention. In FIG. 3, two separate power supply lines Vss1 and Vss2 of a ground potential are provided. Also, a voltage clamp element Q4 is provided between the gate-source of the transistor Q3 to thereby avoid the breakdown of the transistor Q3.

Figure 4:
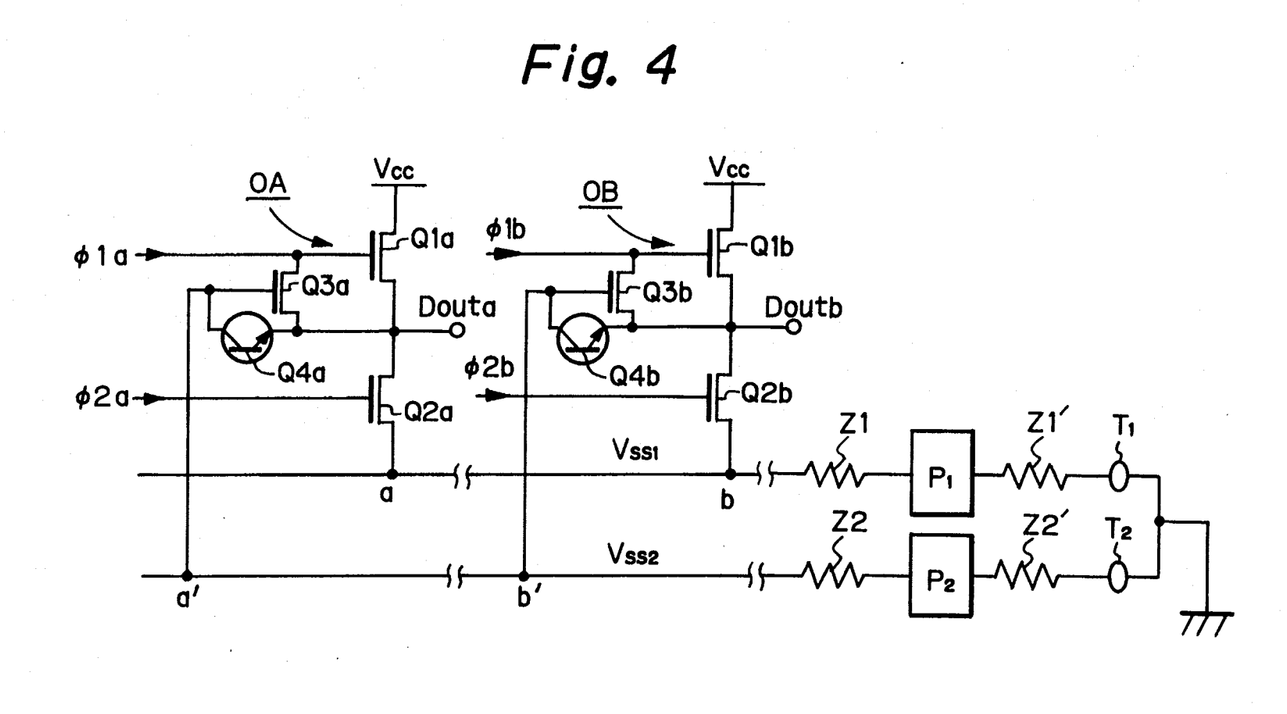
FIG. 4 is a circuit diagram of a semiconductor device wherein a plurality of circuits as illustrated in FIG. 3 are arranged

FIG. 4 illustrates a semiconductor device where in a plurality of the output circuits of FIG. 3 are connected. The power supply lines Vss1 and Vss2 of the ground potential are connected via separate pads P1 and P2 to separate pins T1 and T2. Therefore, as illustrated in FIG. 4, even when these pins P1 and P2 are short-circuited externally and, as a result, are at the same ground potential, the power supply line Vss1 of the ground potential of the output transistors Q2a and Q2b and the power supply line Vss2 of the ground potential of the transistors Q3a and Q3b are hardly influenced by to the presence of impedances $Z_1$ and $Z_2$ due to internal connections and impedances $Z_1'$ and $Z_2'$ due to bonding wires. In other words, even when the ground potential at node b is transiently raised, the ground potential at node a' does not rise enough to turn ON the transistor Q3a. Therefore, erroneous operation due to interference between the plurality of output circuits OA and OB never occurs.

Also, even when a positive or negative electrostatic pulse with respect to the pin T2 of the power supply line Vss2 is applied to the terminal of the output signal Douta, a current flows through the voltage clamp element Q4a connected between the gate-source of the transistor Q3, thus avoiding the breakdown of the gate of the transistor Q3a. Therefore, an electrostatic breakdown tolerance is never deteriorated by the separation of the power supply lines Vss1 and Vss2.

Figure 5A:
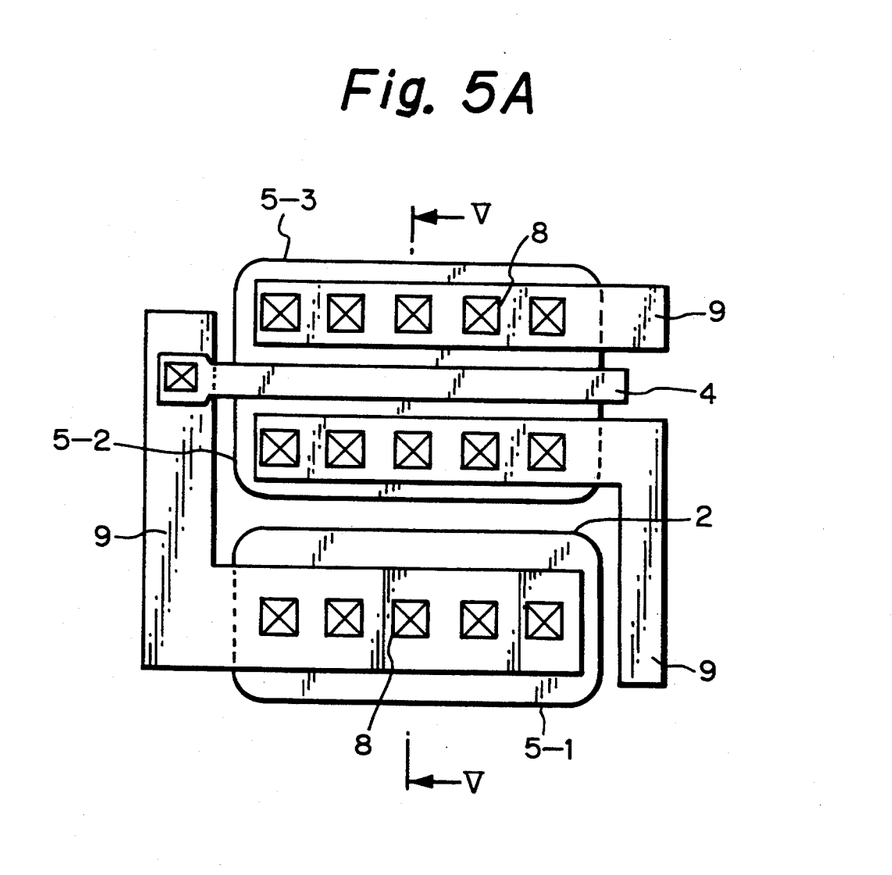
FIG. 5A is a partial plan view of FIG.3.
Figure 5B:
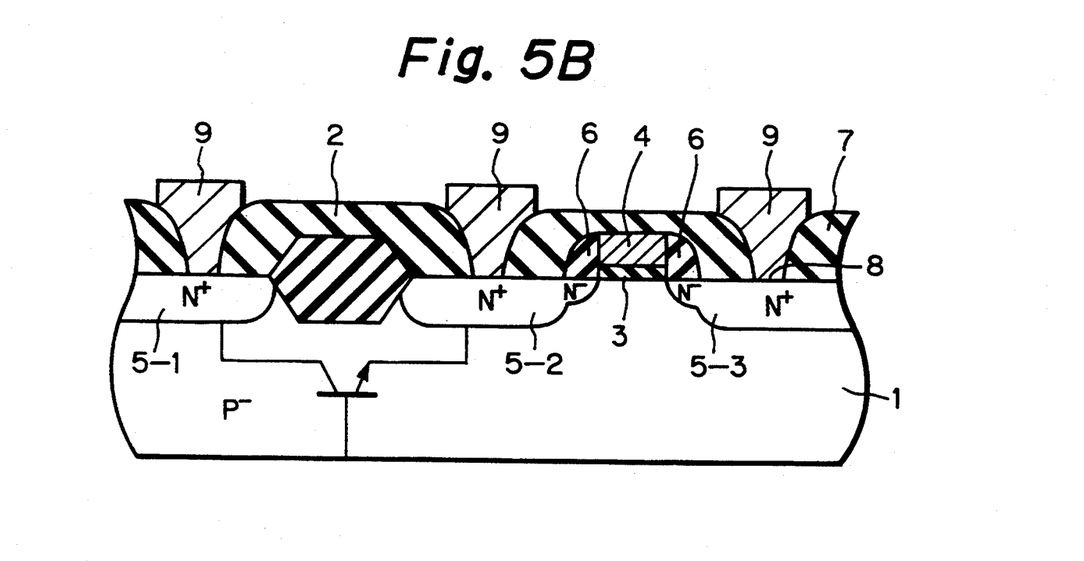
FIG. 5B is a partial cross-sectional view taken along the line V—V of FIG.

Next, an example of configuration of a the transistor Q3 and the voltage clamp element Q4 is explained with reference to FIGS. 5A and 5B. Note that FIG. 5A is a plan view, and FIG. 5B is a cross-sectional view taken along the line V—V of FIG. 5A.

First, a field oxide film 2 for the voltage clamp element Q4 is formed on a P-type semiconductor substrate 1, and also, a gate oxide film 3 for the transistor Q3 is formed. Further, a gate electrode 4 is formed thereon.

On the other hand, N-type impurity diffusion layers 5-1, 5-2 and 5-3 are formed within the substrate 1. In this case, the impurity diffusion layers 5-1 and 5-2 are used for a parasitic bipolar transistor of the voltage clamp element Q4, and the impurity diffusion layers 5-2 and 5-3 are used as a source and a drain of the transistor Q3. Also, reference numeral 6 designates a sidewall insulating layer, and therefore, the source and drain regions of the transistor Q3 are formed by a shallow $N^-$-type layer and a deep $N^+$-type layer to adopt an LDD (Lightly Doped Drain) configuration for enhancing the duration voltage.

Also, reference numeral 7 designates a layer between insulating film in which contact holes 8 are formed toward the impurity diffusion layers 5-1, 5-2 and 5-3, and electrodes made of aluminium are formed therein as connections 9.

Figure 6:
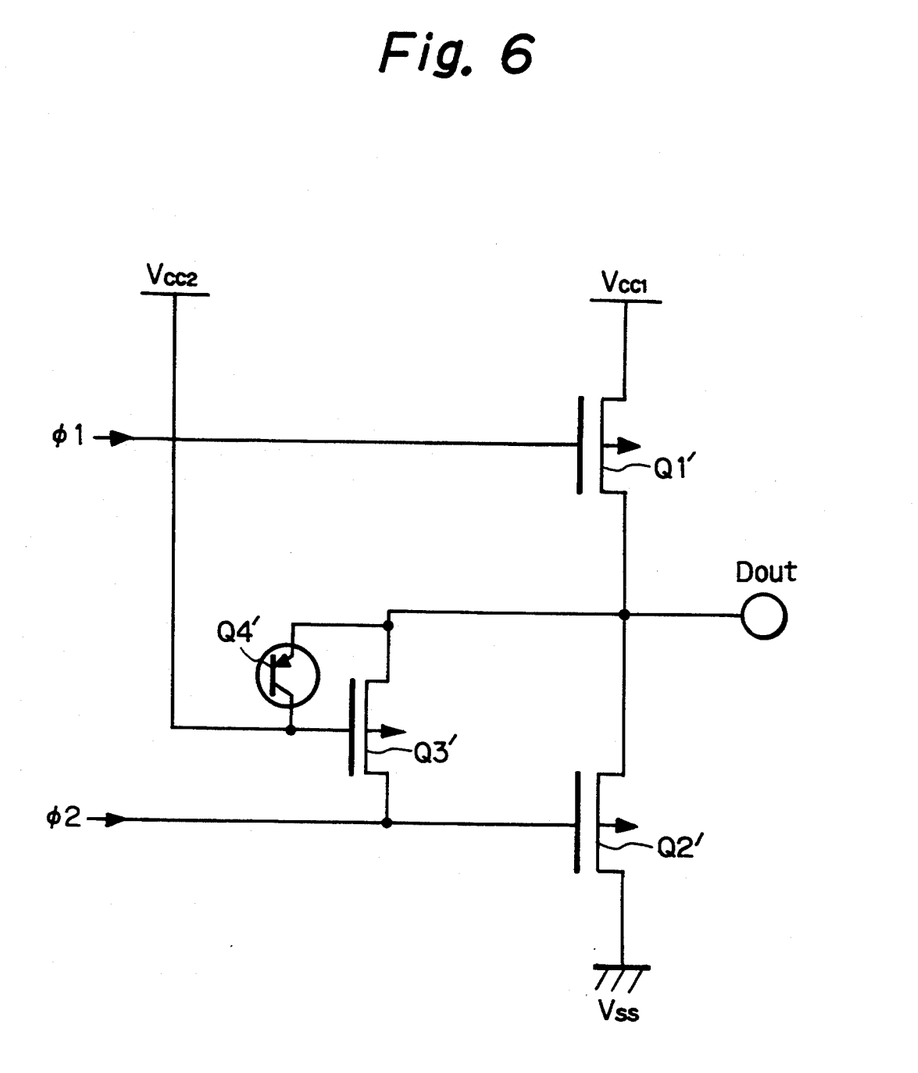
FIG. 6 is a circuit diagram illustrating a second embodiment of the semiconductor device according to the present invention

In FIG. 6, which illustrates a second embodiment of the present invention, P-channel MOS transistors Q1', Q2' and Q3' are provided instead of the N-channel MOS transistors Q1, Q2 and Q3, and two separate power supply lines $V_{cc1}$ and $V_{cc2}$ of a high potential are provided. Also, a voltage clamp element Q4' is provided between the gate-source of the transistor Q3' to thereby avoid the breakdown of the transistor Q3'.

Figure 7:
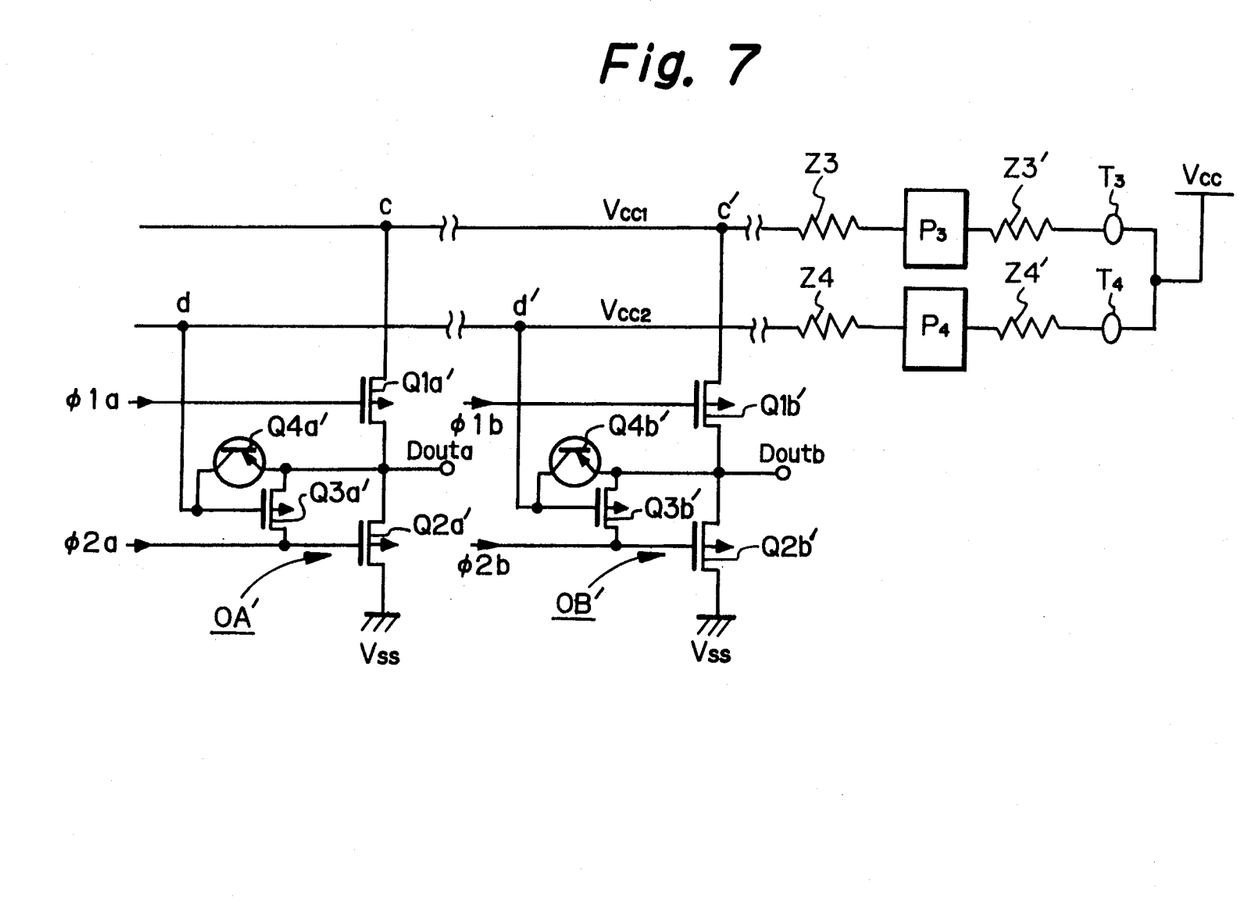
FIG. 7 is a circuit diagram of a semiconductor device wherein a plurality of circuits as illustrated in FIG. 6 are arranged.

FIG. 7 illustrates a semiconductor device wherein a plurality of the output circuits of FIG. 6 are connected. That is, the power supply lines $V_{cc1}$ and $V_{cc2}$ of the high potential are connected via separate pads P3 and P4 to separate pins T3 and T4. Therefore, as illustrated in FIG. 7, even when these pins P3 and P3 are short-circuited externally and, as a result, are at the same high potential, the power supply line $V_{cc1}$ of the high potential of the output transistors Q1a' and Q1b' and the power supply line $V_{cc2}$ of the high potential of the transistors Q3a and Q3b are hardly influenced by to the presence of impedances $Z_3$ and $Z_4$ due to internal connections and impedances $Z_3'$ and $Z_4'$ due to bonding wires. In other words, even when the high potential at node c is transiently raised, the high potential at node d' does not rise enough to turn ON the transistor Q3a. Therefore, erroneous operation due to interference between the plurality of output circuits OA' and OB' never occurs.

Figure 8:
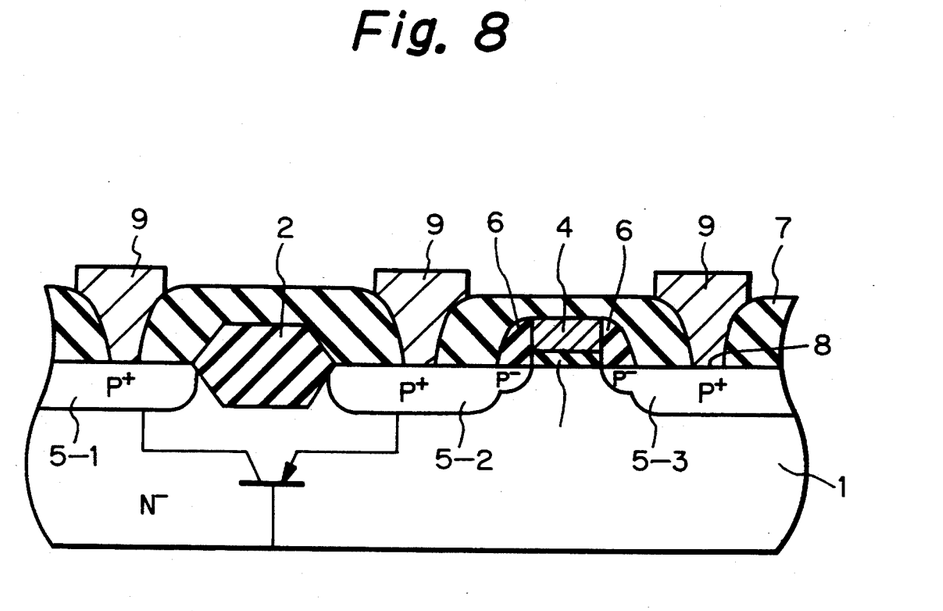
FIG. 8 is a cross-sectional view of a modification of FIG. 6B.

Also, even when a positive or negative electrostatic pulse with respect to the pin T4 of the power supply line $V_{cc2}$ is applied to the terminal of the output signal Douta, a current flows through the voltage clamp element Q4a' connected between the gate-source of the transistor Q3', thus avoiding the breakdown of the gate of the transistor Q3a'. Therefore, an electrostatic breakdown tolerance is never deteriorated by the separation of the power supply lines $V_{cc1}$ and $V_{cc2}$. The transistor Q3' and the voltage clamp element Q4' have the same configuration an illustrated in FIGS. 5A and 5B, except for the impurity types of the semiconductor substrate 1 and the impurity diffusion layers 5-1, 5-2 and 5-3. In this case, the semiconductor substrate 1 is of an N-type, and the impurity diffusion layers 5-1, 5-2 and 5-3 are of a $P^+$-type, as illustrated in FIG. 8.

As explained hereinbefore, when a plurality of output circuits according to the present invention are provided, erroneous operation caused by a mutual interference therebetween can be avoided. Further, the reduction of electrostatic breakdown voltage can be avoided.

I claim:

1. A semiconductor device comprising:
   a first power supply line to which a first potential is applied;
   a second power supply line to which a second potential is applied;
   a third power supply line to which a third potential is applied;
   an output node;
   a first MOS transistor connected between said first power supply line and said node, a gate of said first MOS transistor receiving a first input signal;
   a second MOS transistor connected between said output node and said second power supply line, a gate of said second MOS transistor receiving a second input signal;
   a third MOS transistor connected between said output node and at least one of the gates of said first and second MOS transistors, a gate of said third MOS transistor being controlled by said third power supply line; and a voltage clamp element connected between said output node and a gate of said third MOS transistor 2. A device as set forth in claim 1, wherein said voltage clamp element is constructed by a parasitic bipolar transistor.

3. A semiconductor device comprising:

a first power supply line to which a first potential is applied;

a second power supply line to which a second potential is applied;

a third power supply line to which a third potential is applied;

an output node;

a first MOS transistor connected between said first power supply line and said node, a gate of said first MOS transistor receiving a first input signal;

a second MOS transistor connected between said output node and said second power supply line, a gate of said second MOS transistor receiving a second input signal;

a third MOS transistor connected between said output node and at least one of the gates of said first and second MOS transistors, a gate of said third MOS transistor being controlled by said third power supply line;

a voltage clamp element connected between said output node an a gate of said third MOS transistor, wherein said first potential is a positive high potential and said second and third potentials are ground potentials, said second power supply line being connected via a predetermined impedance to said third power supply line, and said first, second and third MOS transistors being of an N-channel type.

4. A semiconductor device comprising:

a first power supply line to which a first potential is applied;

a second power supply line to which a second potential is applied;

a third power supply line to which a third potential is applied;

an output node;

a first MOS transistor connected between said first power supply line and said node, a gate of said first MOS transistor receiving a first input signal a second MOS transistor connected between said output node and said second power supply line, gate of said second MOS transistor receiving a second input signal;

a third MOS transistor connected between said output node and at least one of the gates of said first and second MOS transistors, a gate of said third MOS transistor being controlled by said third power supply; and a voltage clamp element connected between said output node and a gate of said third MOS transistor, wherein said first potential is a positive high potential and said second and third potentials are ground potentials, said second power supply line being connected via a predetermined impedance to said third power supply line, said first, second and third MOS transistors being of an N-channel type, and said voltage clamp element is constructed by a parasitic bipolar transistor comprising:

a P-type semiconductor substrate serving as a base region of said bipolar transistors;

a field insulating layer formed on said P-type semiconductor substrate; and two N-type impurity regions formed within said P-type semiconductor and being isolated by said field insulating layer, said N-type impurity regions serving an emitter and a collector of said bipolar transistor, respectively, wherein the collector of said parasitic bipolar transistor being connected to a gate of said third M0S transistor, the emitter of said parasitic bipolar transistor being connected to a source of said third MOS transistor.

5. A semiconductor device comprising:

a first power supply line to which a first potential is applied;

a second power supply line to which a second potential is applied;

a third power supply line to which a third potential is applied;

an output node;

a first MOS transistor connected between said first power supply line and said node, a gate of said first MOS transistor receiving a first input signal;

a second MOS transistor connected between said output node and said second power supply line, a gate of said second MOS transistor receiving a second input signal; and a third MOS transistor connected between said output node and at least one of the gates of said first and second MOS transistors, a gate of said third MOS transistor being controlled by said third power supply line, wherein said first and second potentials are positive high potentials and said third potential is a ground potential, said first power supply line being connected via a predetermined impedance to said third power supply line, and said first, second and third MOS transistors being of a P-channel type.

6. A semiconductor device comprising:

a first power supply line to which a first potential is applied;

a second power supply line to which a second potential is applied;

a third power supply line to which a third potential is applied;

an output node;

a first MOS transistor connected between said first power supply line and said node, a gate of said first MOS transistor receiving a first input signal;

a second MOS transistor connected between said output node and said second power supply line, a gate of said second MOS transistor receiving a second input signal;

a third MOS transistor connected between said output node and at least one of the gates of said first and second MOS transistors, a gate of said third MOS transistor being controlled by said third power supply line; and a voltage clamp element connected between said output node and. a gate of said third MOS transistor, wherein said first and second potentials are positive high potentials and said third potential is a ground potential, said first power supply line being connected via a predetermined impedance to said third power supply line, said first, second and third MOS transistors being of a P-channel type, and said voltage clamp element is constructed by a parasitic bipolar transistor comprising:

an N-type semiconductor substrate serving as a base region of said bipolar transistors;

a field insulating layer formed on said N-type semiconductor substrate; and two P-type impurity regions formed within said N-type semiconductor and being isolated by said field insulating layer, said P-type impurity regions serving an emitter and a collector of said bipolar transistor, respectively, wherein the collector of said parasitic bipolar transistor being connected to a gate of said third P-channel transistor, the emitter of said parasitic bipolar transistor being connected to a source of said third P-channel transistor.

7. A semiconductor device comprising:

a high potential power supply line to which a high potential is applied;

a first ground potential power supply line to which the ground potential is applied;

a second ground potential power supply line connected via a predetermined impedance to said first ground potential power supply line;

an output node a first N-channel MOS transistor connected between said high potential power supply line and said output node, a gate of said first N-channel transistor receiving a first input signal;

a second N-channel MOS transistor connected between said output node and said first ground potential power supply line, a gate of said second N-channel transistor receiving a second input signal; and a third N-channel MOS transistor connected between a gate of said first N-channel MOS transistor and said output node, a gate potential of said third N-channel MOS transistor being controlled by said second ground potential power supply line.

8. A device as set forth in claim 7, further comprising a voltage clamp element connected between said second ground potential power supply line and said output node.

9. A device as set forth in claim 8, wherein said voltage clamp element is constructed by a parasitic bipolar transistor.

10. A device as set forth in claim 9, wherein said parasitic bipolar transistor comprises:

a P-type semiconductor substrate serving as a base region of said bipolar transistor; and a field insulating layer formed on said P-type semiconductor substrate; and two N-type impurity regions formed within said P-type semiconductor and being isolated by said field insulating layer, said N-type impurity regions serving an emitter and a collector of said bipolar transistor, respectively, the collector of said parasitic bipolar transistor being connected to a gate of said third N-channel MOS transistor, the emitter of said parasitic bipolar transistor being connected to a source of said third Nchannel MOS transistor.

11. A semiconductor device comprising:

a first high potential power supply line to which a positive high potential is applied;

a second high potential power supply line connected via a predetermined impedance to said first high potential power supply line;

a ground potential power supply line to which the ground potential is applied;

an output node;

a first P-channel MOS transistor connected between said high potential power supply line and said output node, a gate of said first P-channel MOS transistor receiving a first input signal;

a second P-channel MOS transistor connected to said output node and said ground potential power supply line, a gate of said second P-channel MOS transistor receiving a second input signal; and a third P-channel MOS transistor connected between a gate of said first P-channel MOS transistor and said output node, a gate potential of said third P-channel MOS transistor being controlled by said second high potential power supply line.

12. A device as set forth in claim 11, further comprising a voltage clamp element connected between said second high potential power supply line and said output node.

13. A device as set forth in claim 12, wherein said voltage clamp element is constructed by a parasitic bipolar transistor.

14. A device as set forth in claim 13, wherein said parasitic bipolar transistor comprises:

a N-type semiconductor substrate serving as a base region of said bipolar transistor; and a field insulating layer,formed on said N-type semiconductor substrate; and two N-type impurity regions formed within said N-type semiconductor and being isolated by said field insulating layer, said P-type impurity regions serving an emitter and a collector of said bipolar transistor, respectively, the collector of said parasitic bipolar transistor being connected to a gate of said third P-channel MOS transistor,.

the emitter of said parasitic bipolar transistor being connected to a source of said third P-channel MOS transistor.

* * * * *

UNITED STATES PATENT AND TRADEMARK OFFICE
CERTIFICATE OF CORRECTION

PATENT NO. : 5,436,487
DATED : July 25, 1995
INVENTOR(S) : Kaoru Narita

It is certified that error appears in the above-indentified patent and that said Letters Patent is hereby corrected as shown below:

| | |
|---|---|
| Col. 2, Line 2 | after "FIG." , insert --5A--; |
| Col. 4, Line 16 | delete "P$_3$ and P$_3$" and insert --P$_3$ and P$_4$--; |
| Col. 5, Lines 29-30 | delete "a voltage clamp element connected between said output node and a gate of said third MOS transistor"; |
| Col. 5, Line 56 | after "supply", insert --line--; |
| Col. 8, Line 44 | delete "two N-type" and insert --two P-type--. |

Signed and Sealed this

Nineteenth Day of December, 1995

Attest:

BRUCE LEHMAN

*Attesting Officer*  *Commissioner of Patents and Trademarks*